(12) United States Patent
Zhu

(10) Patent No.: US 7,411,432 B1
(45) Date of Patent: Aug. 12, 2008

(54) INTEGRATED CIRCUITS AND COMPLEMENTARY CMOS CIRCUITS FOR FREQUENCY DIVIDERS

(75) Inventor: Xiang Zhu, San Jose, CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 0 days.

(21) Appl. No.: 11/461,222

(22) Filed: Jul. 31, 2006

(51) Int. Cl.
*H03B 19/00* (2006.01)
(52) U.S. Cl. .................... 327/117; 327/115; 327/202; 327/218; 377/47; 326/98
(58) Field of Classification Search ......... 327/113–115, 327/117, 118, 199, 202–212, 214, 215, 218; 377/47, 48, 115–117; 326/93–98
See application file for complete search history.

(56) References Cited

U.S. PATENT DOCUMENTS

| | | | |
|---|---|---|---|
| 4,045,690 A | | 8/1977 | Tam |
| 4,606,059 A | * | 8/1986 | Oida ........................... 377/47 |
| 5,140,179 A | * | 8/1992 | Takano ........................ 327/203 |
| 5,172,400 A | * | 12/1992 | Maemura .................... 377/116 |
| 6,072,850 A | * | 6/2000 | Ueno ........................... 377/47 |
| 6,157,693 A | * | 12/2000 | Jayaraman ................... 377/47 |
| 6,417,711 B2 | * | 7/2002 | Fulkerson ................... 327/203 |
| 6,563,356 B2 | * | 5/2003 | Fulkerson ................... 327/203 |

OTHER PUBLICATIONS

Ajjikuttira, A.B.; Wei Liat Chan; Yong Lian, "*A 5.5 GHz prescaler in 0.18 /spl mu/m CMOS technology*", ASIC, 2002, Proceedings. 2002 IEEE Asia-Pacific Conference on Aug. 6-8, 2002, pp. 69-72.

Pellerano, S.; Levantino, S.; Samori, C.; Lacaita, A.L, "*A 13.5-mW 5-GHz frequency synthesizer with dynamic-logic frequency divider*", Solid-State Circuits, IEEE Journal of vol. 39, Issue 2, Feb. 2004, pp. 378-383.

Mirzaei, A, "*A 5 GHz, 1.5 V and very low-power CMOS frequency synthesizer for wireless communications*," Circuits and Systems, 2002. MWSCAS-2002. The 2002 45th Midwest Symposium on vol. 3, Aug. 4-7, 2002.

Payam Heydari, "*Design and Analysis of Low-Voltage Current-Mode Logic Buffers*," ISQED, p. 293, Fourth International Symposium on Quality Electronic Design, 2003.

Musicer, J.M. Rabaey, J., "*MOS current mode logic for low power, low noise CORDIC computation in mixed-signal environments*", Low Power Electronics and Design, 2000. ISLPED '00, Proceedings of the 2000 International Symposium.

(Continued)

*Primary Examiner*—N. Drew Richards
*Assistant Examiner*—Patrick O'Neill

(57) ABSTRACT

An integrated circuit of an embodiment may comprise synchronous logic, combinational logic, and clock circuitry to clock the synchronous logic through various states dependent on the combinational logic. The synchronous logic may comprise a plurality of master-slave registers. The combinational logic is configured to drive data inputs of the synchronous logic dependent on states established by the master-slave registers. The clock circuitry is configured to clock the master portion of the master-slave registers with a lag rendering of a clock signal and to clock the slave portion of the registers with a lead rendering of the clock signal. In a particular example, the circuitry may define a frequency divider of a complementary CMOS realization.

12 Claims, 4 Drawing Sheets

OTHER PUBLICATIONS

S. Choi, B. Lee, T. Kim and K. Yang, "*CML-type MOnostable BIstable logic element (MOBILE) using InP-based monolithic RTD=HBT Technology*," Electronics Letters, Jun. 24, 2004, vol. 40 No. 13.

Dubin, Joseph, "*Choosing the right multiprocessor development tools*," http://www.embedded.com/showArticle.jhtml?article, Oct. 31, 2005.

"*Finite state machine*" http://en.wikipedia.org/wiki/Finite_state_machine, Wikipedia, the free encyclopedia, Jun. 1, 2006.

Wilson, C. "*Timing and Storage Elements*," CmpE2500 lecture outline for Apr. 25 and 27, 1997, http://www.ece.gatech.edu/research/CmpE2500/day_11/outline,html.

"*Pulsed RF sources*," Microwave Encyclopedia, http://www.microwaves101.com/encyclopedia/pulsedRF.cfm, Jun. 1, 2005.

* cited by examiner

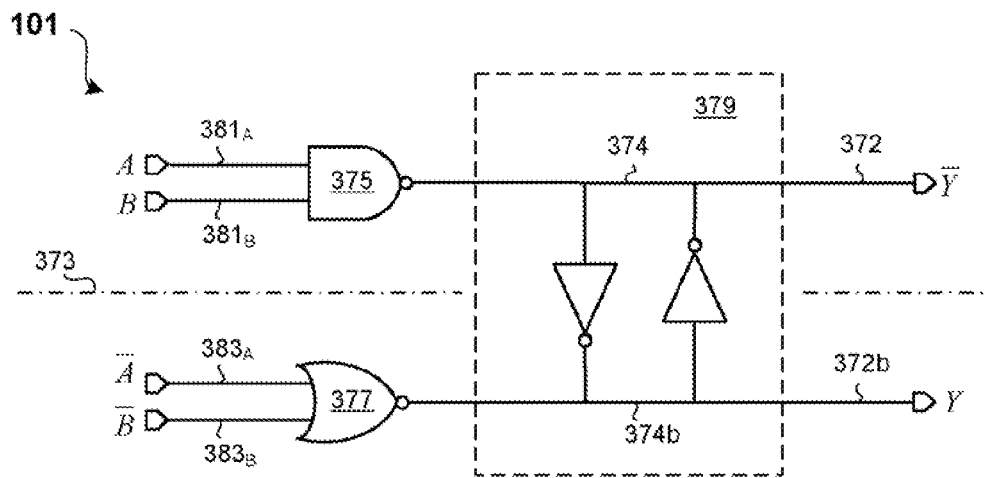
FIG. 2B
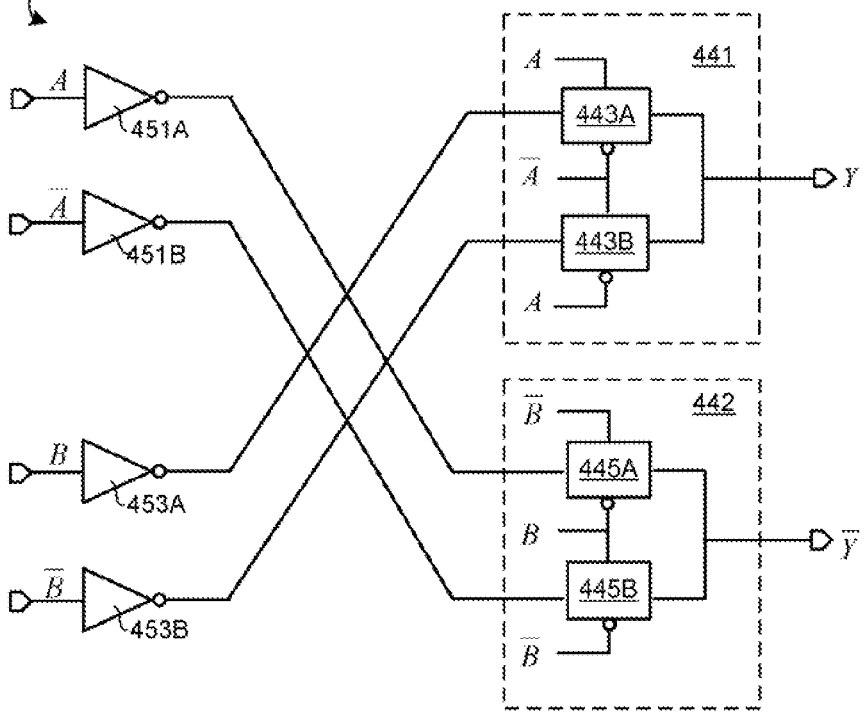
FIG. 3
FIG. 4

INTEGRATED CIRCUITS AND COMPLEMENTARY CMOS CIRCUITS FOR FREQUENCY DIVIDERS

TECHNOLOGY FIELD

The present invention is directed to integrated circuits and, more specifically, to complementary CMOS integrated circuits for high-speed signal synthesis and processing.

BACKGROUND

The evolution of integrated circuits (IC) has led to designs of ever-increasing density and complexity. With these increased levels of integration, artisans within the IC industry often seek various goals for manufacturability, performance and functionality. For example, artisans may seek to design integrated circuits operable to incorporate a large number of different devices of various operabilities so as to assist more versatile integrations and applications. Further, they may also seek to reduce power dissipation by scaling down voltage levels, which may also accommodate reduction in device geometries. In some applications, however, the reduced geometries and reduced voltage levels for the typical CMOS circuit may compromise its speed of operation or immunity to noise.

Typically, different logic families are characterized with distinct properties suited for different goals. For example, current mode logic (CML) may typically be designated for high speed applications, but may come with an expense of high current levels and power dissipation. On the other hand, CMOS logic is generally directed towards low power applications. The power dissipation for customary CMOS logic is generally related to the dynamic needs required during signal transitions for charging or discharging the capacitance of gates within the CMOS circuits. The inherent capacitance of the gates, in turn, may be understood to limit the speed of operation of the CMOS circuits—presenting a trade-off to the low power benefits.

In a particular known system such as a CMOS synchronous circuit, a plurality of registers may be operable to store and/or sequence between various states. The operative speed for the system typically may depend on at least three timing parameters of the registers—setup time, hold time and propagation delay.

In the case of a master-slave register, a gatable switch generally is disposed between the master and slave portions of the master-slave register, which may be operable to enable selective transfer of data therebetween. Another gatable switch at the input may further enable selective application of data to the master portion of the register. These upstream and downstream gatable switches typically are driven by opposite phase renderings of a clock signal.

SUMMARY

In accordance with an embodiment of the present invention, an integrated circuit may comprise synchronous logic, combinational logic and clock circuitry. The clock circuitry may be operable to clock data through the synchronous logic, which may comprise a plurality of master-slave registers. The combinational logic may be operable to drive data inputs of the synchronous logic dependent on the data states of the plurality of master-slave registers. The clock circuitry may be configured to clock the master portion of at least one master-slave register with a lag rendering of a clock signal, and to clock the slave portion of the at least one master-slave register with a lead rendering of the clock signal.

In accordance with a further embodiment, the master portion of the at least one master-slave register may comprise a first latch and true and complementary gatable data paths by which to drive the true and complementary nodes respectively of the first latch. The slave portion of the master-slave register may comprise a second latch and likewise true and complementary gatable data paths by which to drive the true and complementary nodes respectively of the second latch. The clock circuitry is configured to selectively enable the gatable data paths of the master portion based on the lag rendering of the clock signal and to selectively enable the gatable data paths of the slave portion based on the lead rendering of the clock signal.

In a further embodiment, the complementary CMOS logic may be operable to drive true and complementary data inputs of the master portion of the at least one master-slave register based on signals at the output of the at least one master-slave registers. Further, at least one of the combinational logic may be operable to differentially drive the true and complementary data paths for the input of the associated at least one master-slave register. In a particular example, the master-slave registers and the combinational logic form a frequency divider operable to divide the frequency of the clock signal.

In a further embodiment of the present invention, a complementary CMOS circuit comprises a latch and first and second data paths of complementary logic relationship to one the other. The first and second data paths are configured to drive the respective complementary ends of the latch. In a further embodiment, the latch may comprise first and second inverters that are cross coupled input-to-output and output-to-input for the complementary ends of the latch. The first data path for the circuit may comprise a CMOS NAND gate by which to drive the true node (or end) of the latch and the second data path may comprise a CMOS NOR gate, as the CMOS logic complementary to the CMOS NAND, configured to drive the complementary node (or end) of the latch.

In a further embodiment, the circuit may comprise first CMOS logic and second CMOS logic, wherein the second CMOS logic is configured for complementary logic relationship relative to that of the first CMOS logic. The output of the first CMOS logic and the output of the second CMOS logic may be operable collectively as a differential output of substantially balanced push-pull drive capability. In a further embodiment, the first CMOS logic may be operable as an XOR gate, and the second CMOS logic may be operable as the complement of the XOR gate.

BRIEF DESCRIPTION OF DRAWINGS

Subject matter of embodiments for devices and methods of operation for the embodiments of the present invention may be understood by reading the following description with reference to the accompanying drawings in which:

FIG. 2B is a truth table for the master-slave register of FIG. 2A, useful to assist an understanding of an operability of the register, in accordance with an embodiment of the present invention.

FIG. 3 is a simplified schematic of a complementary CMOS circuit for an AND gate, in accordance with an embodiment of the present invention, showing true and complementary CMOS logic for the true and complementary data paths.

FIG. 4 is a simplified schematic of a complementary CMOS circuit for XOR logic, in accordance with an embodiment of the present invention.

DETAILED DESCRIPTION

Figure 1A:
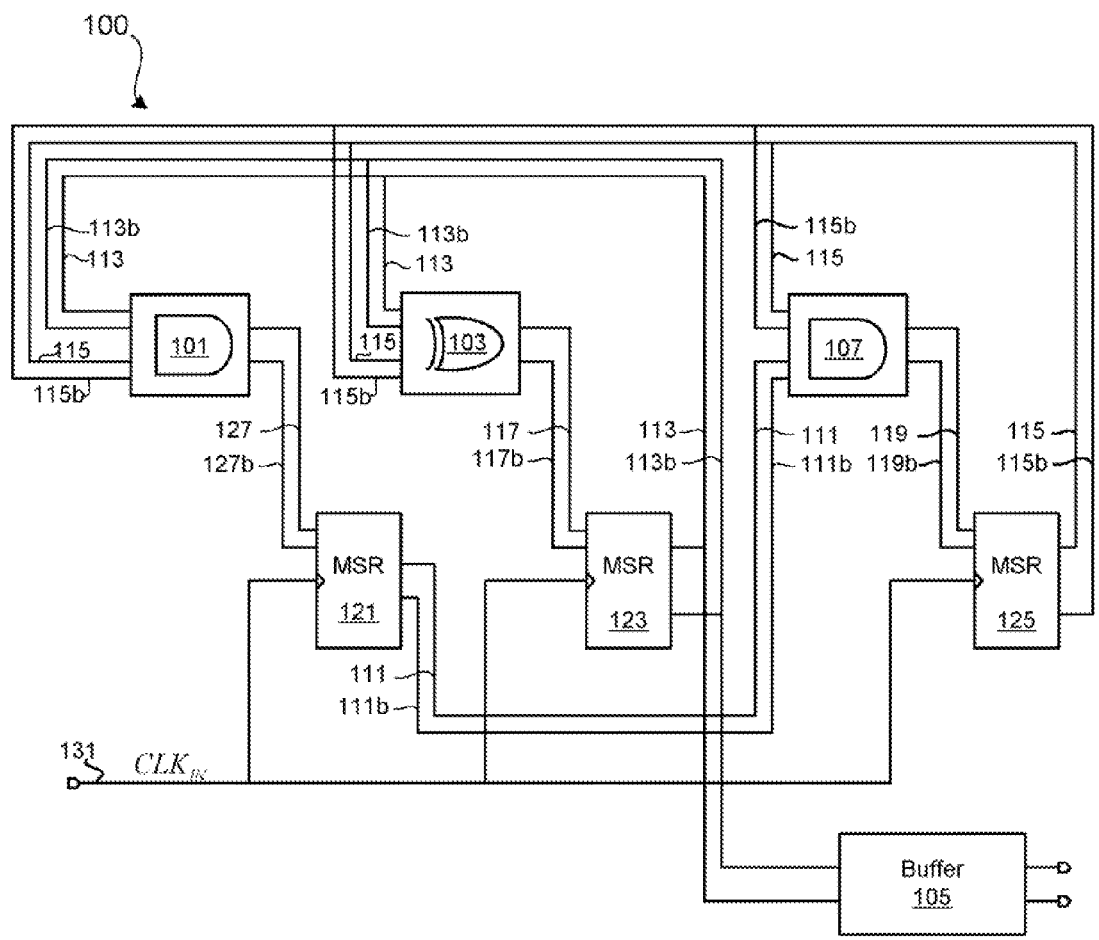
FIG. 1A is a simplified schematic of a complementary CMOS circuit for a frequency divider, in accordance with an embodiment of the present invention.

In the description that follows, readily established circuits and procedures for the exemplary embodiments may be disclosed in simplified form (e.g., simplified block diagrams and/or simplified description) to avoid obscuring an understanding of the embodiments with excess details. Persons of ordinary skill in this art can readily understand their more specific structures and formations by way of the drawings and disclosure. For the same reason, identical components may be given the same reference numerals, regardless of whether they may be shown in different embodiments of the present invention.

As referenced herein, portions of a circuit may be described as being formed in, at or on an electrical device. Such alternative terms in/at/on may be used individually merely for purposes of convenience. In the context of semiconductor integrated circuits, such terms may collectively reference portions of a semiconductor chip that may be within and/or on other starting material.

In accordance with an embodiment of the present invention, referencing FIG. 1A, an integrated circuit 100 includes a state machine defined at least in part by master-slave registers or flip flops 121, 123, 125 and combinational logic 101, 103, 107. The combinational logic may define at least one input to the master-slave registers. Clock circuitry (e.g., 250 of FIG. 2A) may be operable to clock the master and slave portions 204, 202 (FIG. 2A) of the synchronous logic provided by master-slave registers 121, 123, and 125. The clock circuitry 250 may drive the master portions 204 of the master-slave registers with a lag rendering of a clock signal and the slave portions 202 with a lead rendering of the clock signal. The relative difference between the lead and the lag renderings of the clock signal, for one embodiment, may be defined by a given buffer (or inverter) delay.

In a further embodiment, again referencing FIG. 1A, circuit 100 may form a frequency divider. The master-slave registers of the synchronous logic may comprise three master-slave D-type flip flops 121, 123, 125. Combinational logic may define operative AND logic 101, 107 and operative exclusive-OR (XOR) logic 103 for driving respective inputs 127, 127b of master-slave register 121, inputs 117, 117b of master-slave register 123 and inputs 119, 119b of master-slave register 125. In this embodiment, output 113, 113b from register 123 of the master-slave registers may source the output signal of the frequency divider. In a further embodiment, buffer 105 may buffer this output signal.

The operative AND logic 101 may be configured to drive input 127 of master-slave register 121 dependent on the logical AND relationship of the outputs from the second and third master-slave registers 123, 125. The combinational logic for XOR logic 103 may be configured to drive input 117 of the second master-slave register 123 dependent on the logical XOR relationship of the outputs of the second and third master-slave registers 123, 125. The combinational logic for the second AND logic 107 may be configured to drive the input of the third master-slave register 125 dependent on the logical AND relationship of the outputs of the first and third master-slave registers 121, 125. In this particular embodiment, therefore, the synchronous logic in combination with the combinational logic may be operable as a divided-by-five frequency divider.

Figure 2A:
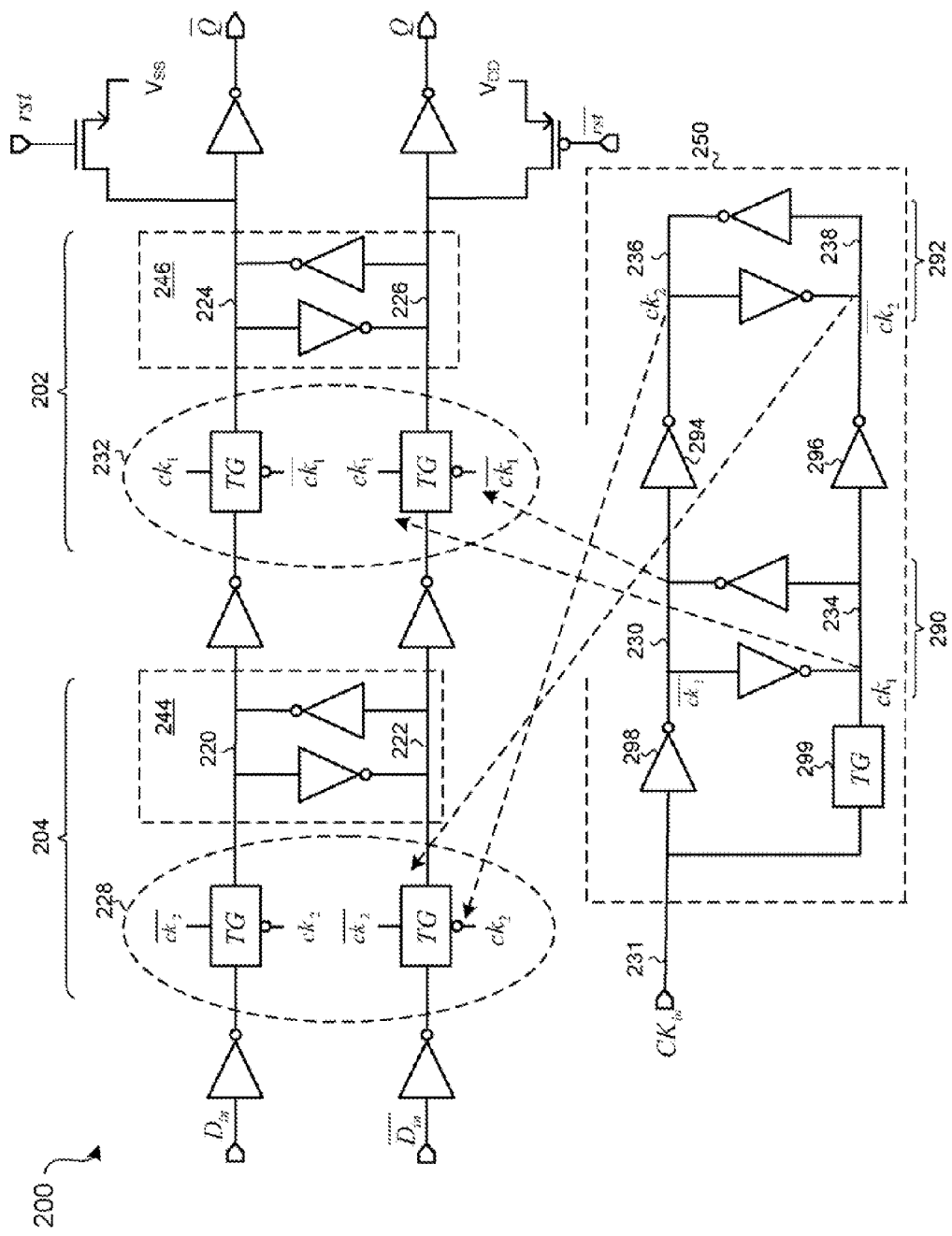
FIG. 2A is a simplified schematic of an integrated circuit, in accordance with an embodiment of the present invention, showing a master-slave register with true and complementary data paths and also showing different master and slave portions of the register that are configured to be clocked by different respective lead and lag renderings of a clock signal.

Referencing FIGS. 1A and 2A, clock circuit 250 may be described as associated with and/or internal to each of the respective master-slave registers 121, 123, 125. In alternative embodiments, the clock circuitry (such as circuitry 250 of FIG. 2A) might be configured to be in common for driving each of the different clock inputs for the master-slave registers.

In a particular embodiment, further referencing FIG. 2A, clock circuitry 250 may comprise first and second latches 290, 292 of input-to-output and output-to-input cross coupled inverters. The cross-coupled nodes for the first pair of inverters for latch 290 may define true and complementary nodes 230, 234. Likewise, the cross-coupled nodes for the second pair of inverters for latch 292 may define true and complementary nodes 236, 238. The true node 230 of first latch 290 may drive the true node 236 of second latch 292 by way of a buffer or inverter 294, and similarly the complementary node 234 of the first latch 290 may drive the complementary node 238 of the second latch 292 by way of buffer or inverter 296. A clock signal $CK_{in}$ may be received at the clock input node 231 of clock circuitry 250 and used to drive the true and complementary nodes 230, 234 of first latch 290 by way of inverter 298 and transmission gate (TG) 299 respectively.

The true and complementary electrical paths driving second latch 292 from first latch 290 may comprise substantially equal propagation delays. Similarly, transmission gate 299 and inverter 298 may similarly be formed with substantially equal propagation delays. Accordingly, these two devices may be described as operable to drive the true and the complementary nodes of the latches with substantially balanced and symmetrical drive. The inverter 298 and transmission gate 299 via the clock output driver may thus serve to supply the true and complementary nodes 230, 234 of first latch 290 with comparable push-pull/pull-push current drive.

Further referencing FIG. 2A, in an embodiment of the present invention, clock circuitry 250 may be described as integrated within master-slave register 200. The true and complementary nodes 236, 238 of the second latch 292 may be used to source a lag rendering of a clock signal; likewise, the true and the complementary nodes 230, 234 of the first leach 290 may electrically source a lead rendering of the clock signal. In this particular embodiment, the lag rendering from the second latch 292 of clock circuitry 250 may drive the switches 228 for master portion 204 of master-slave register 200. The switches 232 for slave portion 202 of the master-slave register may receive the lead rendering of the clock signal as sourced from the first latch 290 of clock circuitry 250. By such lag-lead clocking configuration of the clock circuitry of the master-slave register for certain embodiments of the present invention, the synchronous circuit may thus be operable with reduced latency requirements. Operation of such master-slave register may be further understood with reference to the truth table of FIG. 2B.

In the truth table of FIG. 2B, the left-hand column labeled $CK_{in}$ presents various clock input signal conditions. Two different static conditions of zero and one are presented along with two different transition conditions. The transition condition from zero to one is represented by "I" and the transition condition from one to zero is represented by Φ. In the low-level, static input condition, clock circuitry 250 may yield a low-level signal for both of the lead and lag renderings of the clock outputs $CK_1$, $CK_2$. With such low-level condition for $CK_1$, $CK_2$, the second switches 232 of the slave portion of the master-slave register may be enabled (or "Off"), while the first switches 228 of the master portion may be enabled (or "On"). Note, that the lead rendering, $CK_1$ of a clock signal is illustrated as being sourced from the complementary node 234 of latch 290; whereas, the lag rendering $CK_2$ of the clock signal is shown as being sourced from the true node 236 of the second latch 292.

For high-level, static input condition for the clock signal, the lead rendering $CK_1$ of the clock signal may be high for enabling the second switches 232 of the slave portion 202 of the master-slave register (e.g., register 200), while the lag rendering $CK_2$ of the clock signal is also high for disabling the first switches 228 of the master portion 204 of the register.

During a zero-to-one transition I for the input clock $CK_{in}$, temporary enablement of both the first and second switches 232, 228 may result. Accordingly, during a brief time interval following the transition from low to high, the lead rendering $CK_1$ of the clock signal $CK_1$ may transition to a high condition. While this signal begins to propagate through the buffers of inverters 294, 296, the second latch 292 of the clock circuitry 250 may continue to preserve the previous condition. Thus, the lag rendering $CK_2$ of the clock signal, as presented to the master portion 204 of the master-slave register, may momentarily sustain the first switches 228 in the enabled state. During this momentary duration following the transition, therefore, the first and the second switches 228, 232 for the master and slave portions 202, 204 respectively may both be enabled.

By similar analysis, further referencing the truth table of FIG. 2B, during the alternative transition Φ of the input clock from high to low, both the switches 228 of the master portion 204 and the switches 232 of the slave portion 202 remain disabled.

This master-slave register 200 with the clock circuitry configured for the lag-lead operability, for such embodiment of the present invention, may be described as offering an effective hold-time reduction relative to the more customary operation of typical master-slave registers.

In accordance with a further embodiment of the present invention, the master-slave register 200 may be formed with complementary (or dual) data paths of true and complementary relationship. For example, further referencing FIG. 2A, an upper data path from the data input $D_{in}$ to a first output node $\overline{Q}$ may comprise a series of inverters and transmission gates of effective mirror-image relationship to the lower or complementary path as defined from the complementary data input $\overline{D_{in}}$ to a second output node Q. The master portion 204 for the register may be defined at least in part by a first latch 244 comprising a pair of input-to-output and output-to-input cross-coupled inverters. The true and complementary nodes 220, 222 of the latch are driven by gated, true and complementary data signals. An inverter may buffer the true data input $D_{in}$ for driving the true node 220 of first latch 224 by way of a gatable transmission gate (TG). Likewise, in the complementary data path, another gatable transmission gate (TG) may similarly be configured to control coupling of a buffered complementary data signal of the complementary data input $\overline{D_{in}}$ to the complementary node 222 of the first latch 224.

Similar inverter and transmission gate structures may define slave portion 202 of the master-slave register 200. An inverter and a transmission gate may be disposed in series relationship between true node 220 of first latch 244 and true node 224 of second latch 246. For the complementary data path, another inverter and transmission gate may similarly be disposed in series relationship between complementary node 222 of first latch 244 and complementary node 226 of second latch 246.

In a further embodiment, pull-up/pull-down devices may be configured to allow selective reset of the register. Respective N-channel and P-channel MOSFET devices may be disposed for enabling selective reset of the slave portion of the master-slave registers. The N-channel MOSFET may be disposed with its gatable channel serially between the lower supply $V_{SS}$ and true node 224 of latch 246 for the slave portion 202 of the master-slave register 200. Likewise, a P-channel MOSFET may be disposed with its gatable channel serially between the upper supply $V_{DD}$ and complementary node 226 of latch 246 for the slave portion of the master-slave register 200. Such reset operability may be useful for starting the synchronous logic in a known state and to avoid potential problems of metastability.

Further, referencing FIG. 2A, for embodiments of the present invention, the first and the second latches 290, 292 of clock circuitry 250 may be designed to be operable for substantially balanced differential drive. Accordingly, the PMOS and NMOS devices as known to form the transmission gates (for the switches of the master-slave register) may be driven in substantially balanced and complementary relationship.

Figure 1B:
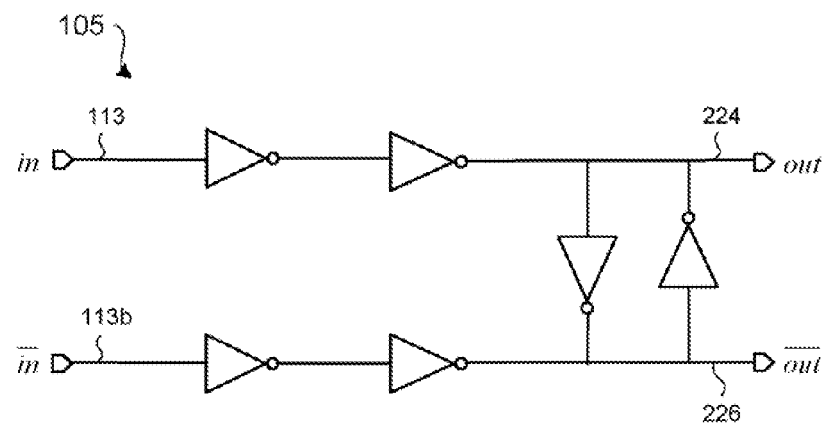
FIG. 1B is a simplified schematic of a buffer for the complementary CMOS circuit of FIG. 1A, in accordance with an embodiment of the present invention.

In accordance with a further alternative embodiment, again referencing FIGS. 1A and 1B, buffer 105 may be incorporated to buffer the output signals of the divided-by-five complementary CMOS circuit 100. For example, referencing FIG. 1B, buffer 105 may include buffer elements (e.g., series of inverters) in each of true and complementary data outputs 224 and 226 for the frequency divider.

In yet a further embodiment of the present invention, referencing FIG. 1A, the true and complementary data inputs for the respective master-slave registers may be driven differentially by the respective combinational logic 101, 103, 107. For example, first AND logic 101 may be operable to drive the true and complementary nodes for the first master-slave register 121 in substantially balanced and differential relationship. Likewise, the second and the third logic 103, 107 may similarly be operable to differentially drive the respective true and complementary nodes for the inputs of their associated master-slave registers 123, 125.

In a particular embodiment, for a divided-by-five frequency divider, the first and the third logic devices 101, 107 may be operable for a logical AND. The first logic 101 may logically AND the signals of the second and the third master-slave registers 123, 125, and the third logic 107 may logically AND the signals of the first and the third master-slave registers 121, 125. Further referencing FIG. 3, the combinational logic for the AND logic may be defined by a complementary CMOS circuit structure. In this embodiment, the complementary CMOS circuit for the AND logic may comprise first and second logic gates of effective complementary logic relationship. The output of the first CMOS logic gate 375 may be operable collectively with the output of the second CMOS logic gate 377 as a differential output of substantially balanced push-pull/pull-push drive capability.

In a further embodiment, further referencing FIG. 3, a latch 379 may be disposed between the true and complementary nodes 372, 372b for the differential output. For example, latch 379 may be defined by first and second CMOS inverters that are cross-coupled input-to-output and output-to-input between the true and complementary nodes. By a particular perspective to assist understanding, the complementary CMOS logic of gates 375, 377, and their true and complementary nodes 374, 374b at opposite ends of latch 379 may be described with complementary logic relationship across an effective logical mirror axis 373. In a particular embodiment for the complementary CMOS circuit for AND logic, the first logic gate may comprise an NAND gate 375 configured to drive true node 374 of latch 379, and the second logic gate (of complementary relationship to the NAND gate) may comprise an NOR gate 377 configured to drive complementary node 374b of latch 379.

In a further embodiment, NAND gate 375 and NOR gate 377 may be designed for substantially balanced drive capability, so as to be operable collectively as a differential drive of substantially symmetrical relationship. Furthermore, it may be understood that the CMOS outputs for each of the inverters that define latch 379 may likewise be designed and formed for substantially equal push-pull current drive operability. Additionally, the first and the second data paths for such complementary CMOS logic may be designed for substantially equal propagation delays.

In realizing a complementary CMOS circuit for exclusive-OR logic, referencing FIG. 4, first and second transmission gates 443A, 443B may have their outputs combined to define a true node Y, as part of a differential output for the exclusive-OR (XOR) logic. The inputs of the transmission gates may be coupled to receive the true and complementary renderings respectively of a second signal via buffers such as, for example, inverters 453A, 453B. The gate of the first transmission gate 443A may be driven by the true rendering A of a first signal, and the gate of the second transmission gate 443B may be driving by the complementary rendering $\overline{A}$ of the first signal.

Further referencing FIG. 4, the third and the fourth transmission gates 445A, 445B may similarly have their outputs combined to define the complementary node $\overline{Y}$ for the differential output of the XOR logic. Their inputs may be driven to receive true and complementary renderings respectively of the first signal via inverters 451A, 451B. The gates of these third and fourth transmission gates 445A, 445B may be driven in complementary form relative to the drives for the gates of transmission gates 443A, 443B. In other words, the gate for the third transmission gate 445A may be configured to receive the complementary rendering $\overline{B}$ of the second signal, and the gate of the fourth transmission gate 445B may be configured to receive the true rendering B of the second signal. The differential output, e.g., Y and $\overline{Y}$, for the complementary CMOS logic of XOR 107 may be configured, for the divide-by-five circuit embodiment of FIG. 1A, to drive the differential input for the second master-slave register 123 and may be described to be operable with substantially balanced push-pull/pull-push current drive capability.

In a further embodiment, such complementary CMOS XOR logic may comprise an additional latch (not shown) disposed between the true and the complementary nodes of the differential output.

Returning with reference to FIG. 1A, for an embodiment of the present invention as a divided-by-five frequency divider, the complementary CMOS circuit for XOR logic may be deemed a critical path of the frequency divider circuit. Accordingly, an additional latch might thus add an unnecessary propagation delay. Therefore, the latch may be omitted from the complementary CMOS circuit for XOR logic of one embodiment, as represented in FIG. 4.

In particular realizations for the divided-by-five frequency divider circuit, it has been found that the complementary CMOS realization for the synchronous circuits can enable high frequency operability at even low operative supply voltages. For given CMOS libraries and processing procedures (for example, of 90-nanometer technology), the divided-by-five frequency divider circuit may be operable up to frequencies as great as 7 GHz, despite an operative voltage as low as 1 volt. It has been further theorized, by way of this disclosure, that by realizing the frequency divider with such complementary CMOS logic structures per certain embodiments of the present invention, current consumption may be kept lower than that which might otherwise be required by typical current mode logic (CML) solutions.

Figure 5:
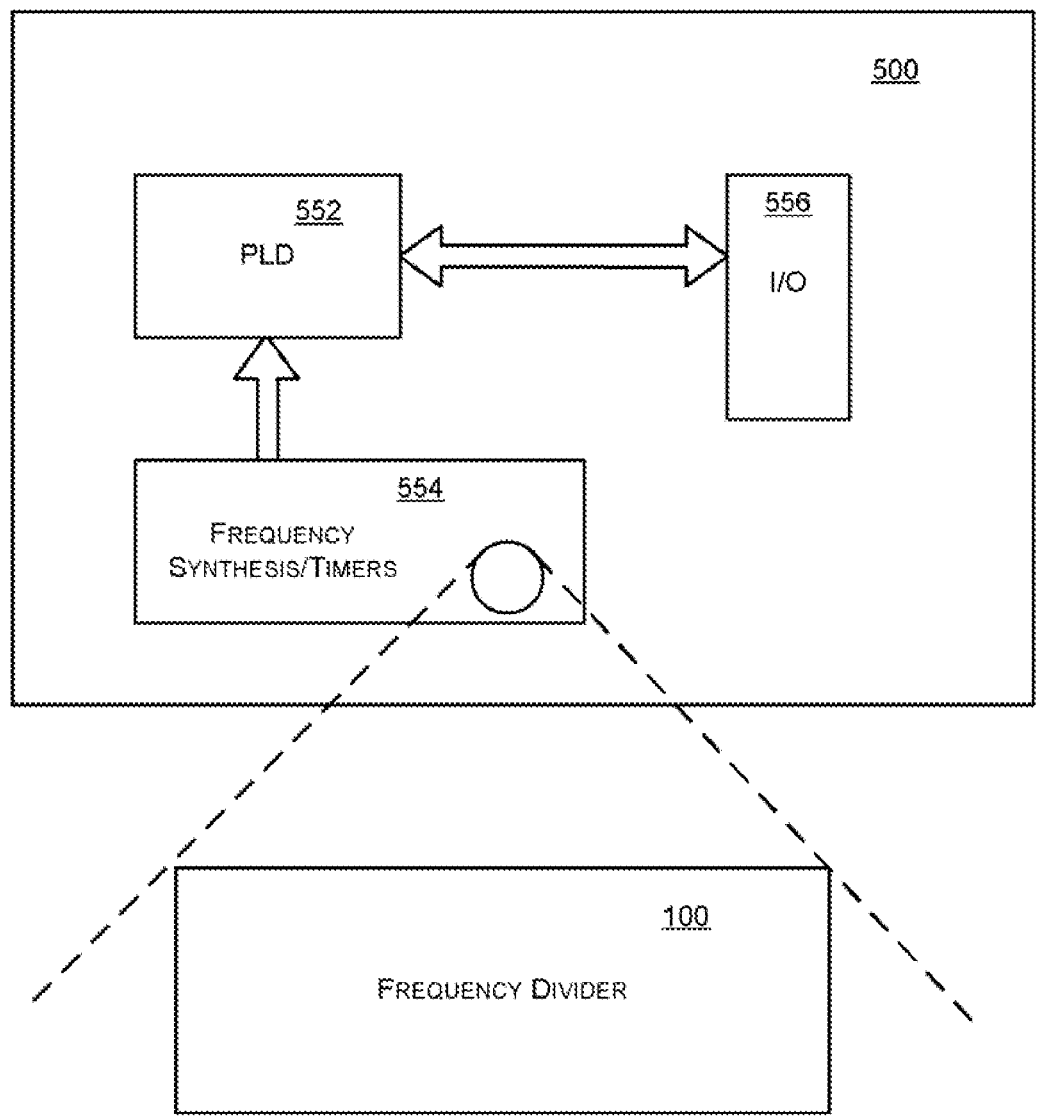
FIG. 5 is a simplified block diagram for a system level integrated circuit, in accordance with an embodiment of the present invention, showing incorporation of a frequency synthesizer/timer circuit with a frequency divider of a complementary CMOS circuit realization, in accordance with an embodiment of the present invention.

In accordance with a further embodiment of the present invention, referencing FIG. 5, an electrical system 500 such as a system-on-chip (SoC) integrated circuit may incorporate a frequency synthesizer or timer circuit 550 defined at least in part by a frequency divider such as that described earlier herein relative to FIGS. 1A-4. Such system 500 may include, for example, a programmable logic device (PLD) 552 or a microprocessor integrated by I/O circuitry 556 of standard CMOS realization integrated together with the frequency synthesis circuit 550. The complementary CMOS circuit realization for the frequency divider per an embodiment described earlier herein may allow the frequency synthesis/timer circuit 554 to be integrated together with the other standard CMOS elements, using the standard CMOS processes already available therefor. Additionally, the complementary CMOS circuit embodiments for the frequency divider of dual, complementary signals for data communication paths may be further theorized (by way of this disclosure) to assist with noise immunity.

Although this invention has been described and illustrated with reference to specific embodiments thereof, the invention is not limited to these embodiments. Those skilled in the art will recognize that variations and modifications can be made to these embodiments without departing from the principles of the invention. Therefore, it is intended to include within this invention all such variations and modifications which fall within the scope of the following claims.

What is claimed is:

1. An integrated circuit, comprising:
   synchronous logic having at least one master-slave register with a data input, in which the master portion comprises a first latch and true and complementary gatable data paths driving the respective true and complementary nodes of the first latch, and the slave portion comprises a second latch and true and complementary gatable data paths to drive the respective true and complementary nodes of the second latch, the gatable data paths each comprising a switch configured to enable selective transfer of a signal therethrough dependent on a gate signal, and an inverter disposed electrically in series with the switch;
   combinational logic to electrically drive at least one data input of the synchronous logic; and
   a clocking circuit to clock the master portion and the slave portion of the at least one master-slave register with respective lag and lead relative renderings of a clock signal, the clocking circuit configured to selectively enable the gatable data paths of the master portion based on the lag rendering of the clock signal and to selectively enable the gatable data paths of the slave portion based on the lead rendering of the clock signal, the clock circuit comprising:
- a first latch of CMOS inverters inter-coupled input-to-output and output-to-input for the respective true and complementary nodes;
- a second latch of CMOS inverters inter-coupled input-to-output and output-to-input for the respective true and complementary nodes;
- a first inverter to invert and forward a signal from the true node of the first latch to a true node of the second latch; and
- a second inverter to invert and forward a signal from the complementary node of the first latch to a complementary node of the second latch;
- the true and complementary nodes of the second latch of the clock circuit operable together as a differential output to source the lag rendering of the clock signal and to drive the switches in the data paths of the master portion of the master-slave register; and
- the true and complementary nodes of the first latch of the clock circuit operable together as a differential output to source the lead rendering of the clock signal and to drive the switches in the data paths of the slave portion of the master-slave register.

2. The circuit of claim 1, in which the clock circuit further comprises:
- a clock input to receive the clock signal;
- an inverter disposed serially between the clock input and the true node of the first latch of the clock circuit; and
- a transfer gate disposed serially between the clock input and the complementary node of the first latch of the clock circuit, the transfer gate formed for a propagation delay of magnitude substantially equal to that for the inverter.

3. The circuit of claim 1, in which the combinational logic is operable to drive the true and complementary data paths of the master portion of the at least one master-slave register based on signal of the true and complementary nodes of the latch of the slave portion of the at least one master-slave register.

4. The circuit of claim 3, in which the synchronous logic comprises first, second and third ones of the master-slave register;
the combinational logic comprises:
- first logic operable to differentially drive the true and complementary data paths of the master portion of the first master-slave register based on a first logic combination of signals of at least two of the true and complementary nodes of the respective latches of the slave portions of the first, the second and the third master-slave registers;
- second logic operable to differentially drive the true and complementary data paths of the master portion of the second master-slave register based on a second logic combination of the signals of at least two of the true and complementary nodes of the respective latches of the slave portions of the first, the second and the third master-slave registers; and
- third logic operable to differentially drive the true and complementary data paths of the master portion of the third master-slave register based on a third logic combination of the signals of at least two of the true and complementary nodes of the respective latches of the slave portions of the first, the second and the third master-slave registers; and the first, the second and the third logic are defined together with the first, the second and the third master-slave registers to form a frequency divider operable to divide the frequency of the clock signal.

5. The circuit of claim 1, in which the combinational logic is configured to differentially drive the true and the complementary data paths of the master portion of the at least one master-slave register with substantially balanced push-and-pull drive current.

6. An integrated circuit, comprising:
synchronous logic having at least one master-slave register with a data input, wherein the master portion comprises a first latch and true and complementary gatable data paths driving the respective true and complementary nodes of the first latch, and the slave portion comprises a second latch and true and complementary gatable data paths to drive the respective true and complementary nodes of the second latch, the gatable data paths each comprising a switch configured to enable selective transfer of a signal therethrough dependent on a gate signal, and an inverter disposed electrically in series with the switch;
combinational logic to electrically drive at least one data input of the synchronous logic, the combinational logic operable to drive the true and complementary data paths of the master portion of the at least one master-slave register based on signal of the true and complementary nodes of the latch of the slave portion of the at least one master-slave register; and
a clocking circuit to clock the master portion and the slave portion of the at least one master-slave register with respective lag and lead relative renderings of a clock signal, the clocking circuit configured to selectively enable the gatable data paths of the master portion based on the lag rendering of the clock signal and to selectively enable the gatable data paths of the slave portion based on the lead rendering of the clock signal,
wherein:
the synchronous logic comprises first, second and third ones of the master-slave register; and
the combinational logic comprises:
- first logic operable to differentially drive the true and complementary data paths of the master portion of the first master-slave register based on a first logic combination of signals of at least two of the true and complementary nodes of the respective latches of the slave portions of the first, the second and the third master-slave registers;
- second logic operable to differentially drive the true and complementary data paths of the master portion of the second master-slave register based on a second logic combination of the signals of at least two of the true and complementary nodes of the respective latches of the slave portions of the first, the second and the third master-slave registers; and
- third logic operable to differentially drive the true and complementary data paths of the master portion of the third master-slave register based on a third logic combination of the signals of at least two of the true and complementary nodes of the respective latches of the slave portions of the first, the second and the third master-slave registers; and the first, the second and the third logic are defined together with the first, the second and the third master-slave registers to form a frequency divider operable to divide the frequency of the clock signal.

7. The circuit of claim 6, in which
the first logic defined an AND gate to logically AND the signal output from the second master slave-register with the output from the third master-slave register;
the second logic defines an XOR gate to logically XOR the signal output from the second master-slave register with that output from the third master-slave register; and
the third logic defines an AND gate to logically AND the signal output from the first master slave register with that output from the third master-slave register;
wherein each of the first, the second and the third logic is configured with full complementary CMOS realization to be operable upon both the true and the complementary data signals from and between the respective master-slave registers and to differentially drive the true and the complementary data paths of the respective master portions of their master-slave registers with substantially balanced push-and-pull current drive.

8. The circuit of claim 7, in which the first logic for operability as the AND gate comprises:
a given latch having a pair of CMOS inverters intercoupled input-to-output and output-to-input for respective true and complementary nodes for the given latch;
a CMOS NAND gate coupled to drive the complementary node of the given latch based on the logical NAND'ing of the true signals from the true outputs of the second and the third master-slave registers; and
a CMOS NOR gate, as the complementary logic to the CMOS NAND gate, coupled to drive the true node of the given latch based on the logical NOR'ing of the complementary signals from the complementary outputs of the second and the third master-slave registers.

9. The circuit of claim 8, in which the second logic for operability as the XOR gate comprises:
first CMOS logic to drive the input of the true data path of the master portion of the second master-slave register; and
second CMOS logic to drive the input of the complementary data path of the master portion of the second master-slave register, the second CMOS logic of operability complementary to that of the first CMOS logic;
wherein the first CMOS logic is operable as an XOR gate and the second CMOS logic is operable as the set and reset of the XOR.

10. A frequency divider circuit comprising:
first, second, and third master-slave registers each having at least one input and at least one output and each responsive to a clock signal having a frequency;
a first logic circuit having an output coupled to the input of the first master-slave register and having inputs coupled to the outputs of the second and third master-slave registers;
a second logic circuit having an output coupled to the input of the second master-slave register and having inputs coupled to the outputs of the second and third master-slave registers; and
a third logic circuit having an output coupled to the input of the third master-slave register and having inputs coupled to the outputs of the first and third master-slave registers,
wherein the second master-slave register is operable to provide at its output an output signal having a frequency that is a divided portion of the clock signal frequency.

11. The frequency divider circuit of claim 10, wherein the first logic circuit comprises an AND gate, the second logic circuit comprises an XOR gate, and the third logic circuit comprises an AND gate.

12. The frequency divider circuit of claim 10, wherein the inputs and outputs of the logic circuits and master-slave registers are differential inputs and outputs, and the output signal of the second master-slave register is a differential output signal.

* * * * *